United States Patent
Ciechanowski et al.

(10) Patent No.: US 9,114,060 B2
(45) Date of Patent: Aug. 25, 2015

(54) INTERFACE SYSTEM FOR TUBS

(75) Inventors: Dominique Ciechanowski, Sainte-Marguerite de Dorchester (CA); Miguel Castellote, Sainte-Marguerite de Dorchester (CA)

(73) Assignee: C.G. AIR SYSTEMES INC., Sainte-Marguerite de Dorchester (CA)

( * ) Notice: Subject to any disclaimer, the term of this patent is extended or adjusted under 35 U.S.C. 154(b) by 989 days.

(21) Appl. No.: 11/776,592

(22) Filed: Jul. 12, 2007

(65) Prior Publication Data

US 2008/0012734 A1    Jan. 17, 2008

Related U.S. Application Data

(60) Provisional application No. 60/807,124, filed on Jul. 12, 2006.

(51) Int. Cl.
*H03K 17/94* (2006.01)
*A61H 33/00* (2006.01)

(52) U.S. Cl.
CPC ............. *A61H 33/60* (2013.01); *A61H 33/005* (2013.01); *A61H 33/00* (2013.01); *A61H 2201/5015* (2013.01); *A61H 2201/5035* (2013.01); *A61H 2201/5046* (2013.01); *H03K 2217/96079* (2013.01); *H03K 2217/960755* (2013.01)

(58) Field of Classification Search
CPC .................................................... A61H 33/60
USPC ........................ 341/33, 20–23; 385/129, 147
See application file for complete search history.

(56) References Cited

U.S. PATENT DOCUMENTS

| | | |
|---|---|---|
| 4,233,694 A | 11/1980 | Janosko et al. |
| 4,577,353 A | 3/1986 | Viegener |
| 4,716,605 A | 1/1988 | Shepherd et al. |
| 4,780,917 A | 11/1988 | Hancock |
| 4,791,258 A | 12/1988 | Youtz et al. |
| 4,823,413 A | 4/1989 | Chalberg et al. |
| 4,844,333 A | 7/1989 | Davis et al. |
| 5,548,854 A | 8/1996 | Bloemer et al. |
| 5,983,416 A | 11/1999 | Idland |
| 6,253,227 B1 | 6/2001 | Tompkins et al. |
| 6,498,600 B1 * | 12/2002 | Vance et al. ................... 345/168 |
| 6,608,617 B2 * | 8/2003 | Hoffknecht et al. ........... 345/173 |
| 6,664,489 B2 * | 12/2003 | Kleinhans et al. ............ 200/313 |
| 6,681,414 B1 | 1/2004 | May et al. |
| 6,747,367 B2 | 6/2004 | Cline et al. |
| 6,775,863 B2 | 8/2004 | Hutchings |
| 6,874,175 B2 | 4/2005 | Laflamme et al. |

(Continued)

FOREIGN PATENT DOCUMENTS

CA    2430862       12/2004
CA    2430862 A1 *  12/2004

*Primary Examiner* — Amine Benlagsir
(74) *Attorney, Agent, or Firm* — Norton Rose Fulbright Canada LLP

(57) ABSTRACT

An interface system for a tub system comprises a screen plate adapted to be mounted to a tub wall. The screen plate has keys representing functions of the tub system, and being made of a material allowing light to pass therethrough. Lights are positioned in register with the keys of the screen plate and concealed from a visible surface of the tub. A controller is adapted to receive commands from a user of the tub to actuate any selected function of the tub system. A light actuator actuates the lights to light up the keys associated with the selected function to visually indicate actuation of the selected function of the tub system through the keys.

7 Claims, 2 Drawing Sheets

(56) References Cited

U.S. PATENT DOCUMENTS

| | | | |
|---|---|---|---|
| 6,875,913 B2* | 4/2005 | Bubar | 84/423 R |
| 6,879,863 B2 | 4/2005 | Mueller et al. | |
| 7,053,799 B2* | 5/2006 | Yu et al. | 341/31 |
| 7,394,367 B1* | 7/2008 | Aupperle et al. | 340/540 |
| 7,606,552 B2* | 10/2009 | Orr et al. | 455/343.1 |
| 7,643,008 B2* | 1/2010 | Uusitalo et al. | 345/173 |
| 2002/0067144 A1* | 6/2002 | Hoffknecht et al. | 315/291 |
| 2002/0135457 A1* | 9/2002 | Sandbach et al. | 338/47 |
| 2003/0005514 A1* | 1/2003 | Kunkel | 4/615 |
| 2004/0083877 A1* | 5/2004 | Bubar | 84/423 R |
| 2004/0199991 A1* | 10/2004 | Ciechanowski | 4/541.1 |
| 2005/0030048 A1* | 2/2005 | Bolender et al. | 324/661 |
| 2005/0168900 A1* | 8/2005 | Brochu et al. | 361/93.1 |
| 2006/0096021 A1 | 5/2006 | Hutchings | |
| 2006/0132458 A1* | 6/2006 | Garfio et al. | 345/173 |
| 2006/0187211 A1* | 8/2006 | Uusitalo et al. | 345/169 |
| 2007/0018965 A1* | 1/2007 | Paun et al. | 345/173 |
| 2007/0042816 A1* | 2/2007 | Chan | 455/575.1 |
| 2007/0069915 A1* | 3/2007 | Becke et al. | 340/815.4 |
| 2007/0102525 A1* | 5/2007 | Orr et al. | 235/472.01 |
| 2007/0284235 A1* | 12/2007 | Conzola et al. | 200/5 A |

* cited by examiner

INTERFACE SYSTEM FOR TUBS

CROSS-REFERENCE TO RELATED APPLICATION

The present patent application claims priority on U.S. Provisional Patent Application No. 60/807,124, filed on Jul. 12, 2006.

FIELD OF THE APPLICATION

The present application relates to actuated systems such as jet massage systems, magnetotherapy systems, aromatherapy systems, foot-massage systems, heating systems and the like used in tubs (i.e., bathtubs, hot tubs, whirlpools and similar basins), and more particularly to a keyboard to actuate these systems in tubs.

BACKGROUND OF THE ART

Tubs are well known for their primary use, namely a washroom installation in which a user person washes and bathes. Tubs have, however, evolved to add relaxation and comfort to practicality, and are found in many forms, such as bathtubs, spas, whirlpools.

For instance, tubs are now provided with air-jet systems and whirlpool systems, by which air or water is injected into the water of the tub to create some turbulence in the water. The turbulence creates a massaging effect on the bather in the tub. Other types of electrically actuated systems, such as oxygenation systems, foot-massage systems and aromatherapy systems are provided in conjunction with tubs, whereby a plurality of treatments are available with tubs. Such systems are often actuated by mechanical switches, which are triggered by closed contacts on circuitry.

One of the issues associated with such switches is the potential of electrical hazards associated with the liquid in the tubs. Also, mechanical switches are not particularly esthetic.

The bather having recourse to such treatments seeks amongst other things a moment of relaxation. It is therefore desired to simplify the use of all such systems to ensure that the bather benefits from relaxing in the tub.

SUMMARY OF THE APPLICATION

It is therefore an aim of the present invention to provide a touchscreen keyboard system addressing issues associated with the prior art.

Therefore, in accordance with the present application, there is provided an interface system for a tub system, comprising a screen plate adapted to be mounted to a tub wall, the screen plate having keys representing functions of the tub system, and being made of a material allowing light to pass therethrough; lights positioned in register with the keys of the screen plate and concealed from a visible surface of the tub; a controller receiving commands from a user of the tub to actuate any selected function of the tub system; and a light actuator actuating the lights to light up the keys associated with the selected function to visually indicate actuation of the selected function of the tub system through the keys.

DESCRIPTION OF THE PREFERRED EMBODIMENTS

Figure 1:
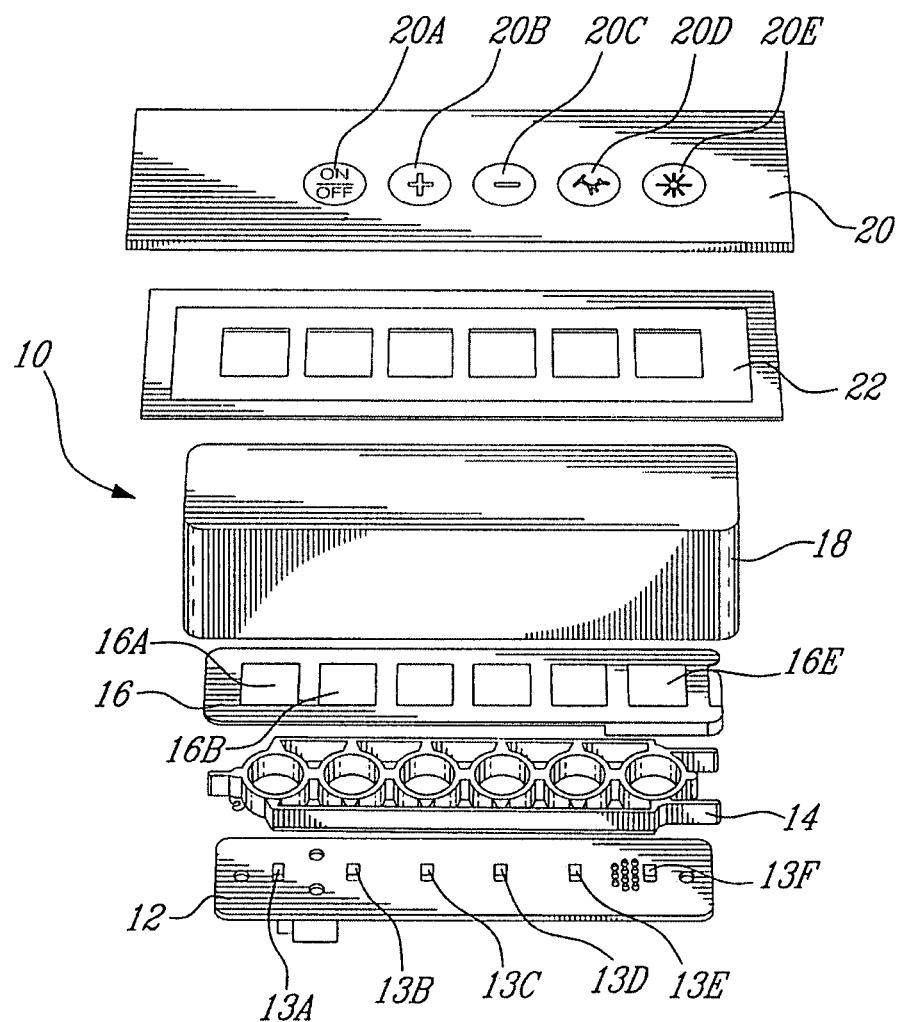
FIG. 1 is an exploded view of a touchscreen keyboard system for tubs in accordance with an embodiment of the present invention.

Referring now to FIG. 1, a touchscreen keyboard for tubs in accordance with an embodiment is generally shown at 10. The touchscreen keyboard system 10 is an interface between a tub user and a tub system, and has a circuit board 12 with lights 13 (e.g., LEDs), a tubular spacer 14, a sensor plate 16, a watertight box 18, a screen plate 20, and a layer of adhesive 22.

The circuit board 12 has a microprocessor and circuitry, in addition to the lights 13, so as enable the various functions performed by the touchscreen keyboard system described hereinafter.

The tubular spacer 14 is provided to separate the circuit board 12 and lights 13 from the screen plate 20, so as to ensure uniform lighting of the keys of the screen plate 20 (e.g., avoid optical cross talk). Light-emitting diodes (i.e., LEDS) are particularly well suited to be used in the touchscreen keyboard system 10.

The sensor plate 16 is wired to the circuit board 12, and has capacitive sensors 16A, 16B, 16C, etc. The capacitive sensors or like sensors are triggered by the proximity of an object, such as a finger of a user person, to actuate functions of a tub system associated with the system 10.

It is contemplated to provide other types of presence-detecting sensors. For instance, touchless switches (i.e., that can be triggered without mechanical contact) are preferred. Examples include of touchless sensors include surface acoustic wave systems, as well as reed switches.

The watertight box 18 accommodates the circuit board 12, the tubular spacer 14 and the sensor plate 16. The box 18 is watertight, considering that the circuit board 12 and the sensor plate 16 are wired to a power source. All necessary precautions are taken to avoid electrical hazards.

The screen plate 20 is mounted onto the top surface of the watertight box 18. The screen plate 20 has keys 20A, 20B, 20C, etc. The keys are typically screen-printed onto the screen plate 20, and are in register with the capacitive sensors 16A, 16B and 16C and with associated lights 13 on the circuit board 12. The keys 20 represent symbols related to different functions of the tub system used with the touchscreen keyboard system 10 (e.g., on/off, ±, etc.). Considering that the sensors used in the system 10 are preferably touchless sensors, the screen plate 20 is typically a simple flat plate of translucent or transparent material. Moreover, in the preferred embodiment involving touchless switches, the keys each are a surface of the screen plate 20 in register with one of the sensors 16A to 16E so as to be sensitive to the presence of an object. Indicia or symbols delimit the sensitive surface forming the key.

As the keys 20A-20E are selectively lit by the lights 13 in a sequence to be described hereinafter, the various components of the system 10 are made of an transparent or translucent material (i.e., materials allowing light to pass through), to allow light to be seen through the keys 20A-20E. Therefore, the sensor plate 16, the top surface 18 of the watertight box 18 and the screen plate 20 are translucent or transparent.

The screen plate 20 is secured to the watertight box 18, for instance using an adhesive 22. The screen plate 20 being the interface between the user and the tub system, the screen plate 20 is typically embedded in a wall of the tub 24, so as to be the only visible part of the touchscreen keyboard system 10. The screen plate 20 is sealingly mounted to the tub wall 24 (FIG.

2) so as to avoid infiltration of water through a gap between the screen plate 20 and the tub wall 24.

Figure 2:
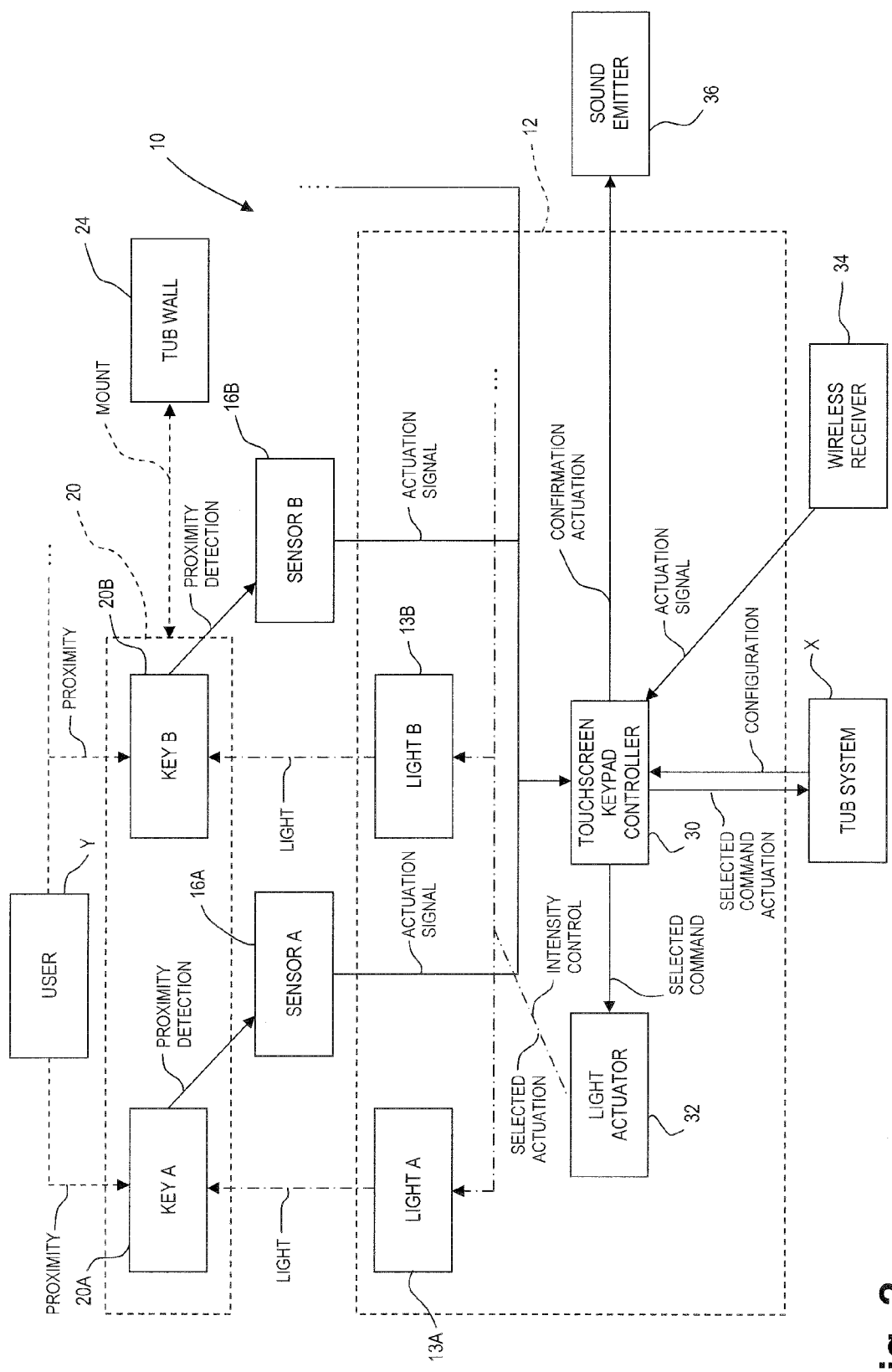
FIG. 2 is a block diagram of the touchscreen keyboard system of FIG. 1.

Referring to FIG. 2, the touchscreen keyboard system 10 is shown with greater details with respect to the circuit board 12 and components thereof.

The circuit board 12, in addition to the lights 13 (illustrated as lights 13A and 13B), has a controller 30. The controller 30 has a processing unit, so as to identify command actuations to send to the tub system X according to the user Y's selection. More specifically, the controller 30 is connected to the sensors 16A, 16B, etc. of the sensor plate 16 (FIG. 1), and therefore receives actuation signals associated with the user Y' selection.

The controller 30 receives the signals and sends appropriate command actuations to the tub system X (e.g., start, increase/decrease level, stop). A signal is also sent to a light actuator 32.

The light actuator 32 controls the lighting of the keys 20A, 20B, etc., according to the functions of the system 10. For instance, the system 10 is programmed to light up the keys 20 being triggered by the user Y, to confirm to the user Y that his/her selection has been received.

It may be desired to keep one or more lights 13 lit, to indicate that the tub system X is operating. For instance, the light actuator 32 may keep an "ON" key (from the keys 20) lit when the tub system X is operating.

Alternatively, the light actuator 32 may actuate lights 13 for the options that are available. As an example, if the maximum intensity level of injecting air for the air massage tub system Y has been reached, the light associated with the "+" key may be turned off while the light associated with the "−" key is kept on. In such a case, the symbols in the screen plate 20 (FIG. 1) may be hidden unless lit.

The light actuator 32 is also preferably programmed to vary the intensity of the light emitted by the lights 13. For instance, the lights 13 may always have some dim lighting, the intensity of which is increased to confirm a selection by the user Y. Again, in such a case, the symbols in the screen plate 20 (FIG. 1) may be hidden unless lit.

In another embodiment, the controller 30 is connected to a wireless receiver 34. The wireless receiver 34 receives commands from a remote control. The controller 30 sends corresponding command actuations to the tub system X, as well as selected commands to the light actuator 32. In such a case, the light actuator 32 preferably confirms the reception of the wireless signal by actuating the lights 13 according to the above-described functions of the system 10. In such a case, it is considered to simplify the system by splicing the actuation line of the appropriate light 13 to the command line sending a signal from the controller 30 to the tub system X.

A sound emitter 36 is also optionally connected to the controller 30. The sound emitter 36 is actuated to confirm action by way of an audible signal to the user Y.

The touchscreen keypad system 10 is typically used with tub systems (a.k.a., apparatuses) such as jet massage system, foot-massage systems, aromatherapy systems, magneto-therapy systems, surface-heating systems, and other similar actuatable tub systems.

The invention claimed is:

1. A tubing assembly of comprising:
 a tub defining a bathing cavity and having at least one tub wall with an opening in the tub wall;
 a tub system mounted about the tub for performing an action related to the bathing cavity in the tub; and
 an interface system comprising:
 a screen plate consisting in a continuous, completely flat and opening-free top surface, the screen plate being mounted to the tub wall and sealingly secured to a periphery of the opening in the tub wall to close the opening in the tub wall and prevent water infiltration through the opening in the tub wall, the screen plate having keys positioned onto the top surface of the screen plate so as to be visibly exposed without backlighting and representing functions of the tub system, and the screen plate being made of a material allowing light to pass therethrough, the screen plate being sized to fully cover the opening in the tub wall;
 lights are positioned in register with the keys of the screen plate and the lights are concealed from a visible surface of the tub;
 a controller inside of the opening in the tub wall and concealed from the visible surface of the tub and receiving commands from a user of the tub to actuate a selected function of the functions of the tub system;
 a light actuator inside of the opening in the tub wall concealed from the visible surface of the tub and actuating the lights to light up the keys associated with the functions to visually indicate actuation of the selected function of the functions of the tub system through the keys;
 touchless sensors concealed from the visible surface of the tub and associated with each key of the keys of the screen plate, wherein the touchless sensors are capacitive switches and wherein the capacitive switches are on a plate positioned between the screen plate and the lights, the plate being made of the material allowing the light to pass therethrough;
 tubular spacers concealed from the visible surface of the tub and being about each tubular spacer of the tubular spacers to guide the light emitted by said lights through said keys;
 a casing concealed from the visible surface of the tub and enclosing the controller, the light actuator, the lights, the tubular spacers and the plate supporting the capacitive switches, the casing being made at least partially of the material allowing the light to pass therethrough, the casing being connected to the screen plate; and
 a wireless receiver concealed from the visible surface of the tub and for receiving commands from a remote control and transmitting the received commands from the remote control to the controller, the controller actuating the tub system as a function of the received commands from the remote control and the light actuator actuating the lights to light up the keys associated with the functions to visually indicate the actuation of the selected function of the functions of the tub system through the remote control.

2. The tubing assembly according to claim 1, wherein the touchless sensors being triggered to actuate the functions of the tub system.

3. The tubing assembly according to claim 2, further comprising a sound emitter concealed from the visible surface of the tub and for emitting a sound when a first function is selected through any one of said touchless sensors to confirm audibly the first selected function.

4. The tubing assembly according to claim 2, wherein the keys are represented by symbols screen-printed on the screen plate.

5. The tubing assembly according to claim 1, wherein the controller and the light actuator are mounted on a printed-circuit board upon which said lights are mounted.

6. The tubing assembly according to claim 1, wherein the tub system is any one of a jet massage system, a foot-massage system, an aromatherapy system, a magnetotherapy system, and a surface-heating system.

7. The tubing assembly according to claim 1, wherein the screen plate is embedded in the tub wall to cover the opening in the tub wall.

* * * * *